United States Patent
Wang et al.

(10) Patent No.: US 9,920,452 B2
(45) Date of Patent: Mar. 20, 2018

(54) METHOD OF PREPARING A MONOCRYSTALLINE DIAMOND ABRASIVE GRAIN

(71) Applicant: BEIJING POLYSTAR HITECH CO., LTD., Beijing (CN)

(72) Inventors: Zhenyu Wang, Beijing (CN); Xiaogang Hu, Beijing (CN); Yuanwei Wang, Beijing (CN)

(73) Assignee: BEIJING POLYSTAR HITECH CO., LTD., Beijing (CN)

( * ) Notice: Subject to any disclaimer, the term of this patent is extended or adjusted under 35 U.S.C. 154(b) by 197 days.

(21) Appl. No.: 15/029,776

(22) PCT Filed: Jul. 29, 2014

(86) PCT No.: PCT/CN2014/083192
§ 371 (c)(1),
(2) Date: Apr. 15, 2016

(87) PCT Pub. No.: WO2015/085777
PCT Pub. Date: Jun. 18, 2015

(65) Prior Publication Data
US 2016/0281264 A1    Sep. 29, 2016

(30) Foreign Application Priority Data
Dec. 11, 2013   (CN) .......................... 2013 1 0675871

(51) Int. Cl.
*C23C 18/50*   (2006.01)
*C23C 18/48*   (2006.01)
(Continued)

(52) U.S. Cl.
CPC ................ *C30B 29/04* (2013.01); *C09G 1/02* (2013.01); *C30B 29/60* (2013.01); *C30B 33/02* (2013.01); *C30B 33/10* (2013.01)

(58) Field of Classification Search
CPC .......... C23C 18/48; C23C 18/50; C30B 33/10
See application file for complete search history.

(56) References Cited

U.S. PATENT DOCUMENTS 3,779,873 A * 12/1973 Dewar ...................... C25D 7/00
                                                    205/144
3,924,031 A * 12/1975 Nicholas .............. C09K 3/1445
                                                    427/217
(Continued)

FOREIGN PATENT DOCUMENTS

CN       1301615 A     7/2001
CN     101918603 A    12/2010
(Continued)

OTHER PUBLICATIONS

Dec. 9, 2014 International Search Report issued in International Patent Application No. PCT/CN2014/083192.
Dec. 9, 2014 Written Opinion issued in International Patent Application No. PCT/CN2014/083192.

*Primary Examiner* — Pegah Parvini
(74) *Attorney, Agent, or Firm* — Oliff PLC

(57) ABSTRACT

The present invention relates to method of preparing a monocrystalline diamond abrasive grain comprising the steps of: sufficiently dispersing a micron-scale monocrystalline diamond and at least a micron-scale metal powder in a sol containing at least a nano-scale metal powder, and controlling the suitable ratio of the two kinds of metal powder with different order of magnitude of particle size, accordingly the micron-scale metal powder can be stuffed into voids among the monocrystalline diamond grains, and only a suitable amount of nano-scale metal powder is required to let the micron-scale metal powder and nano-scale metal powder coat together on the surface of the micron-scale diamond to form an integral and uniform coating layer including at least two kinds of metal grains, thus the resulting monocrystalline diamond abrasive grains (Continued)

have a unique rough-surface morphology, a plurality of contact points and contact surfaces resenting in the grinding process and good self-sharpening.

20 Claims, 2 Drawing Sheets

(51) Int. Cl.
*C30B 29/04* (2006.01)
*C30B 29/60* (2006.01)
*C30B 33/02* (2006.01)
*C30B 33/10* (2006.01)
*C09G 1/02* (2006.01)

(56) References Cited

U.S. PATENT DOCUMENTS

| | | | | |
|---|---|---|---|---|
| 5,190,796 A | * | 3/1993 | Iacovangelo | ........... C23C 18/50 |
| | | | | 205/158 |
| 2002/0014041 A1 | * | 2/2002 | Baldoni | ............... C09K 3/1445 |
| | | | | 51/308 |

FOREIGN PATENT DOCUMENTS

| | | |
|---|---|---|
| CN | 102245730 A | 11/2011 |
| CN | 103694955 A | 4/2014 |
| RU | 2429195 C1 | 9/2011 |

* cited by examiner

METHOD OF PREPARING A MONOCRYSTALLINE DIAMOND ABRASIVE GRAIN

FIELD OF THE INVENTION

The present invention relates to a method of preparing a monocrystalline diamond abrasive grain, belonging to the field of grinding and polishing.

BACKGROUND OF THE INVENTION

Diamond is the hardest substance in known natural world which is 1000 times the absolute hardness of quartz. Accordingly, diamond is widely applied to the field of grinding process of various hard materials due to its incomparable high hardness and excellent mechanical physical performance. Diamond micro powder, regarded as the hardest ultrafine abrasive, is the ideal material for grinding and polishing hard materials, such as cemented carbide, ceramica, gemstone, optical glass, manual crystal. Wherein, a monocrystalline diamond micro powder is obtained through the pulverization and classification of diamond synthesized by a static high-pressure method which has a microscopic morphology of irregular polyhedron with an acute edge angle, so as to provide a strong grinding force. However, the sharp edge angle is very easy to scratch the surface of a workpiece when using the monocrystalline diamond to grind and polish the workpiece, thereby more working procedures for repairing the aforesaid scratches are needed in order to reach the requirement on a higher flatness of the workpiece surface.

As the development of ultra-precision grinding and polishing technology, the researchers find when heat treating a diamond micro powder with some metal coating, the metal coating can promote a phase transformation from diamond to graphite; then the metal coating on the diamond surface is cleaned and dissolved by using common acid and non-diamond carbon on the surface of diamond micro powder is removed by using oxidative acid, the treated monocrystalline diamond micro powder presents a unique rough-surface morphology and further presents a plurality of contact points and contact surfaces during grinding and polishing process, therefore it has good self-sharpening.

The Chinese patent document of CN102245730A discloses a monocrystalline diamond particle having a unique morphology, and a metal is coated on the monocrystalline diamond particle surface by the following two methods, method 1: adopting the electroless nickel plating to form a nickel coated diamond, the specific operating steps are as follows: (1) subjecting the uncoated diamond particles to contact a solution of colloidal palladium so as to make the fine palladium particles uniformly absorb onto the surface of the diamond, the activating treatment on the surface of the diamond micro-powder by using the palladium particles enhances the auto-catalyzed property of the electroless deposited nickel on the surface of the diamond micropowder; (2) placing the activated diamond into nickel sulfamate solution containing 10 g/L dissolved nickel and simultaneously adding a sodium hypophosphate and maintaining the temperature at about 80° C., when the dissolved nickel in solution will autocatalytically deposit onto the activated diamond surfaces method 2: adopting a mix-compress manner of diamond micro powder and iron powder to form an intimate mixture of diamond particles and iron particles, the specific operating steps are as follows: (1) mixing diamond particles and iron powder in the mass ratio of 1:9-1:4, adding a certain binder to provide lubricity to particle surface so as to allow a denser packing and intimate contact between the iron powder and diamond, thus the mixture is compressed to form a intimate mixture of diamond and iron powder in the form of a pellet, an aggregate or other compressed mixture; (2) then heat treating the prepared metal-coated diamond particles by the above two methods in a vacuum atmosphere, hydrogen atmosphere or inert gas atmosphere in the temperature range of 650-1000° C. for 0.5-5 hours, so as to achieve an graphitization of the diamond surface, and then cooling the heat treated particles; (3) finally, processing acid cleaning and non-diamond carbon dissolution to obtain the monocrystalline diamond particles having a unique morphology. However, in the method 1, a high activation treatment degree of diamond particle surface is required in the electroless nickel plating process, otherwise an integral and uniform nickel coating layer is difficult to form, additionally, a large number of discard solution containing nickel will be produced after electroless plating, thus increasing the cost for treating the discard solution. While adopting the method 2 may effectively avoid the above problems. However, in method 2, the adopted iron powder and diamond micro powder are both at micron scale, and the micron-scale monocrystalline diamond particle and micron-scale iron powder have a insufficient contact when mixing them, resulting in a difficulty to form a integral and uniform iron coating layer on the monocrystalline diamond particle surface, further the microscopic morphology of the product shows that a larger pit emerges on the surface of the monocrystalline diamond particle produced by this method. Additionally, when mixing the micron-scale iron powder and micron-scale diamond micro powder, the amount of iron powder is a plurality of times of diamond micro powder so as to ensure a sufficient surface contact of the iron powder and diamond particle, both causing waste of raw material and increasing burden and cost of acid post-treatment.

SUMMARY OF THE INVENTION

An object of the present invention is to solve the technical problem in the prior art that it is difficult to form a integral and uniform metal coating layer on the surface of the monocrystalline diamond powder when using a metal powder and a monocrystalline diamond powder with the same order of magnitude of particle size to coat the monocrystalline diamond surface by a mix-compress manner, making the surface of the monocrystalline diamond micro grain have larger pits, less contact points during grinding process and poor self-sharpening, and further to provides a preparation method of a monocrystalline diamond micro grain having good self-sharpening.

In order to solve the above described technical problem, the present invention is realized through the following technical solution:

In an embodiment, a method of preparing a monocrystalline diamond abrasive grain comprising the steps of:

(1) dispersing a micron-scale monocrystalline diamond and at least a micron-scale metal powder into a sol containing at least a nano-scale metal powder, and stirring to form a uniformly dispersed slurry; wherein, the mass ratio of the micron-scale monocrystalline diamond to the nano-scale metal powder is 1:1-4:1;

the mass ratio of the micron-scale monocrystalline diamond to the micron-scale metal powder is 5:1-20:1;

the molar concentration of the nano-scale metal powder in the sol is 1-4 mol/L;

(2) granulating the slurry and obtaining a composite particle of the monocrystalline diamond and the two kinds of metal powder in a form of a spherical agglomeration;

(3) placing the composite particle of step (2) into an vacuum furnace and heating at a temperature of 600-1000° C. for 0.5-5 hours and cooling to room temperature;

(4) treating the composite particle after step (3) with an inorganic acid and an oxidative acid in sequence, washing to neutrality with water and drying to form the monocrystalline diamond abrasive grain.

In an embodiment, the micron-scale metal powder and the nano-scale metal powder comprise at least two kinds of metals in total.

In an embodiment, the diameter of the micron-scale monocrystalline diamond is 0.1-30 µm; the diameter of the nano-scale metal powder is 10-100 nm; the diameter of the micron-scale metal powder is 0.1-10 µm.

In an embodiment, a solvent of the sol containing the nano-scale metal powder is deionized water and/or absolute ethyl alcohol.

In an embodiment, the nano-scale metal powder and the micron-scale metal powder are respectively selected from the following group of metal powder:

iron powder, cobalt powder, nickel powder, manganese powder, or alloyed powder mixed with two or more of iron, cobalt, nickel or manganese.

In an embodiment, the granulation method in step (2) is a stirring granulation method, a spray-drying method, a boiling granulation method, an extrusion-spheronization granulation method or a centrifugal granulation method.

In an embodiment, the diameter of the composite particle in step (2) is 10-200 µm.

In an embodiment, in step (3), the heating is carried out in a hydrogen atmosphere, vacuum atmosphere, or an inert gas atmosphere inside the vacuum furnace.

In an embodiment, in step (4), the inorganic acid treatment and the oxidative acid treatment comprise the following specific operations:

adding the inorganic acid into the composite particle and treating for 3-5 hours at 80-100° C.;

adding the oxidative acid to the composite particle after the inorganic acid treatment, and treating for 6-8 hours at 150-200° C.

Compared with the prior art, the above described technical solution in the present invention has the following advantages:

(1) A method of preparing a monocrystalline diamond abrasive grain comprising the steps of: sufficiently dispersing a micron-scale monocrystalline diamond and at least a micron-scale metal powder in a sol containing at least a nano-scale metal powder; and controlling the suitable ratio of the two kinds of metal powder with different order of magnitude of particle size, accordingly the micron-scale metal powder can be stuffed into voids among the monocrystalline diamond grains so as to reduce the volume of the voids among the monocrystalline diamond grains; and further mixing with nano-scale metal powder, wherein, only a suitable amount of nano-scale metal powder is required to let the micron-scale metal powder and nano-scale metal powder coat together on the surface of the micron-scale diamond to form an integral and uniform coating layer including at least two kinds of metal grains, which reduces consumption of nano-scale metal powder to some extent. However, in the prior art, coating is carried out by mixing and compressing the single metal powder and the monocrystalline diamond powder with the same order of magnitude of particle size, so it is very difficult to realize a sufficient surface contact between the micron-scale monocrystalline diamond grains and the micron-scale metal powder, resulting in a difficulty to form a integral and uniform metal coating layer on the surface of the monocrystalline diamond grains, therefore the surface of the resulting monocrystalline diamond abrasive grains have some larger pits, as well as few contact points during grinding process, and poor self-sharpening; simultaneously, the consumption of the metal powder is a plurality of times of that of diamond micro powder so as to ensure a sufficient surface contact between the metal powder and the diamond grains. The preparation method of the embodiment saves the raw material, reduces cost and meanwhile eliminates the processing step of post processing for excess metal powder, and the monocrystalline diamond abrasive grain produced by the present invention has a unique rough-surface morphology, a layered surface, an uneven surface, a plurality of contact points and contact surfaces in the grinding process, good self-sharpening and consequently strong grinding force.

(2) The preparation method of a monocrystalline diamond abrasive grain of the present invention, further defines that the micron-scale metal powder and the nano-scale metal powder comprise at least two kinds of metals in total, thus the coating layer formed by using the present invention method comprises at least two kinds of metal phase, and because the reaction temperature of diamond transforming into graphite directly relates to the eutectic temperature of carbon and metals on the surface thereof, and further because the melting point of alloy formed by two or more metals is lower than that of any one of the metals, thereby, the eutectic temperature of carbon and two or more metals is lower than that of carbon and that of any one of the metals; Therefore, compared with the coating layer only containing a metal grain, the required temperature for transforming diamond on the surface of the monocrystalline diamond grain of the present invention into graphite is greatly reduced, as a result, the temperature for heat treating the monocrystalline diamond grain is lowered (3) In the preparation method of a monocrystalline diamond abrasive grain of the present invention, the diameter of the micron-scale monocrystalline diamond is controlled between 0.4 µm and 30 µm, the diameter of the micron-scale metal powder is controlled between 0.1 um and 10 µm, and the diameter of the nano-scale metal powder is controlled between 10 nm and 100 nm, accordingly, when adding the micron-scale monocrystalline diamond and the micron-scale metal powder into the sol containing nano-scale metal powder, and after mixing them, the metal powder of 0.1-10 µm and the metal powder of 10-100 nm are easier to sufficiently and orderly contact to the surface of the diamond of 0.1-30 µm, thus forming a integral and uniform coating layer comprising at least two kinds of metal grains on the surface after pelletizing.

(4) In the preparation method of a monocrystalline diamond abrasive grain of the present invention, the nano-scale metal powder and the micron-scale metal powder are respectively selected from the following group of metal powder: iron powder, cobalt powder, nickel powder, manganese powder, or alloyed powder mixed with two or more of iron, cobalt, nickel or manganese. Because the above-mentioned metals have a similar atomic structure with the monocrystalline diamond, they can play a role of catalysis to promote the surface of monocrystalline diamond to transform into graphite when phase transition occurs on the surface.

(5) In the step (3) of the preparation method of a monocrystalline diamond abrasive grain of the present invention, the heating is carried out in a hydrogen atmosphere, vacuum atmosphere, or an inert gas atmosphere inside the vacuum furnace, thus effectively avoiding oxidizing the metal powder, and further ensuring a homogeneous reaction of micro-scale metal powder and nano-scale metal powder on the monocrystalline diamond surface; simultaneously avoiding a quality loss caused by oxidation of diamond grains.

DESCRIPTION OF DRAWINGS

The present invention will be further described in detail with reference to the accompanying drawings so that the disclosure of the present invention can be easier to understand clearly, wherein.

DETAILED DESCRIPTION OF THE EMBODIMENTS

EXAMPLE 1

Figure 1:
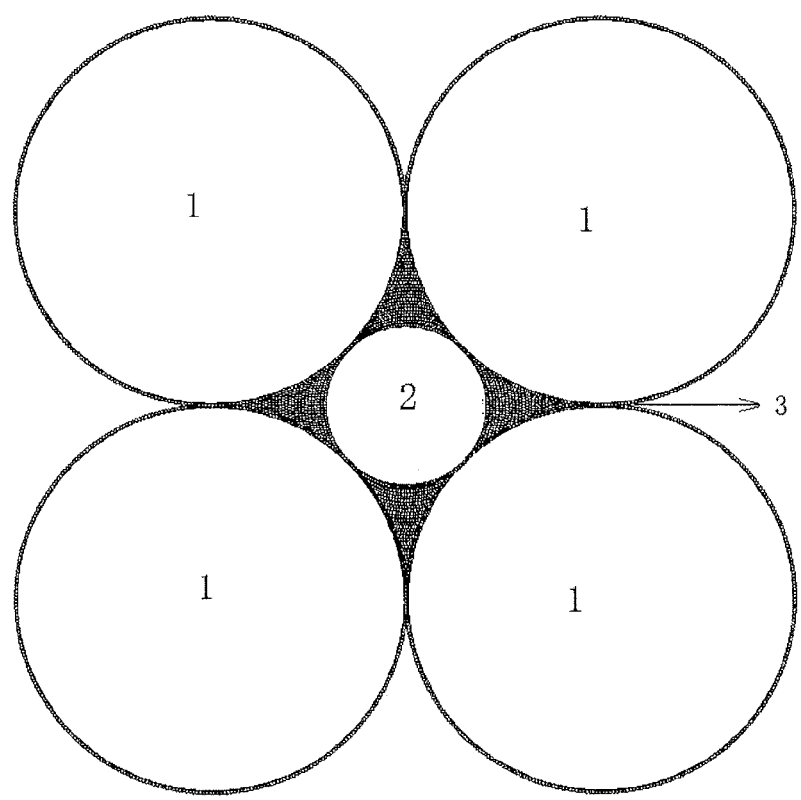
FIG. 1 is a schematic structure view of a part of a monocrystalline diamond-metal powder composite particle in the form of a spherical agglomeration of the present invention.
Figure 2:
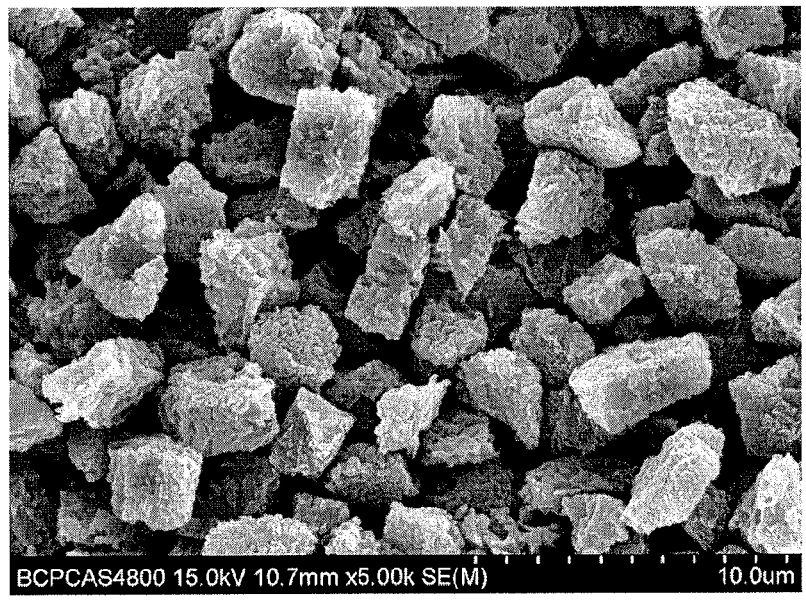
FIG. 2 is a scanning electron microscope (SEM) image of 2.98 μm of the monocrystalline diamond abrasive grain of the present invention.

The embodiment provides a monocrystalline diamond abrasive grain, and the preparation method thereof comprises the following steps:

(1) 100 g of monocrystalline diamond having a diameter of 3.21 μm and 10 g of iron powder having a diameter of 1 μm were dispersed into 500 mL of a nano nickel sol having a molar concentration of 1 mol/L, the sol was stirred to form a uniformly dispersed slurry, wherein the nano nickel solute of the sol has a diameter of 50 nm and the solvent of sol is deionized water; in the slurry, the mass ratio of the monocrystalline diamond to the nano metal powder is 3.4:1, the mass ratio of the monocrystalline diamond to the micron-scale metal powder is 10:1;

(2) the slurry was granulated by a spray drying process to obtain a monocrystalline diamond-nickel-iron composite particle in the form of a spherical agglomeration having a diameter of 50 μm, and FIG. 1 shows a schematic structure view of a part of a monocrystalline diamond-nickel-iron composite particle in the form of a spherical agglomeration comprising a micron-scale monocrystalline diamond grain, a micron-scale metal grain, as well as an nano-scale metal grain;

(3) the composite particles obtained from step (2) were placed in an vacuum furnace of nitrogen atmosphere at 850° C. for 2 hours and then cooled to room temperature;

(4) 1000 mL of dilute nitric acid with a mass concentration of 30% was added into the composite particle of step (3), and the inorganic acid treating is carried out for 3 hours at 80° C. so as to remove the nickel grain and iron grain from the composite particle; the liquid after sedimentation was dumped and obtained wet powder, the wet power was washed 3 times with the deionized water and then dried to obtain dry powder; concentrated sulfuric acid was added into the dry powder for oxidative acid treating for 6 hours at 150° C. so as to remove non-diamond carbon from the monocrystalline diamond surface, then it was washed with water to neutrality and finally dried to obtain the monocrystalline diamond abrasive grain having a unique surface morphology, a median diameter (D50) of 2.98 μm. FIG. 2 is a scanning electron microscope (SEM) image of 2.98 μm of the monocrystalline diamond abrasive grain, it can be seen that the monocrystalline diamond abrasive grain has a unique rough-surface morphology, a layered surface, an uneven surface, a plurality of contact points and contact surfaces presented in the grinding process, a high self-sharpening, thus the grinding force is high. After the above treatments, the yield rate of the monocrystalline diamond abrasive grain is 53.7%, and the formula of computation of the yield rate is in the following:

Yield Rate=(quality before treatments-quality after treatments)/ quality before treatments.

EXAMPLE 2

Figure 3:
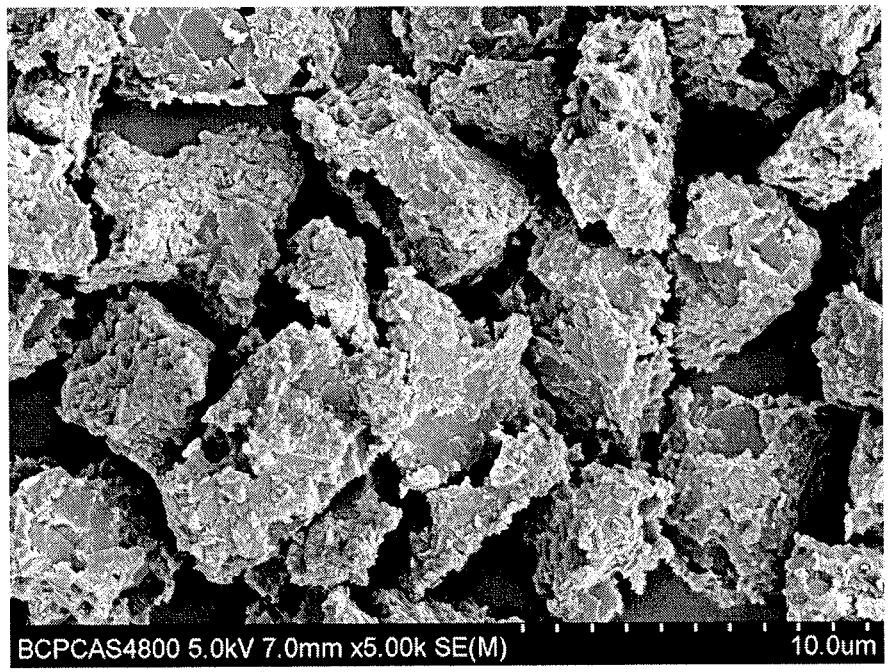
FIG. 3 is a scanning electron microscope (SEM) image of 6.13 μm of the monocrystalline diamond abrasive grain of the present invention.

The embodiment provides a method of preparing a monocrystalline diamond abrasive grain comprising the steps of:

(1) 100 g of monocrystalline diamond having a diameter of 6.49 μm and 10 g of iron powder having a diameter of 2 μm were dispersed into 500 mL of a nano nickel sol having a molar concentration of 2 mol/L, the sol was stired to form a uniformly dispersed slurry, wherein, the nano nickel solute of the sol has a diameter of 50 nm and the solvent of sol is absolute ethyl alcohol; in the slurry, the mass ratio of the monocrystalline diamond to nanometal powder is 1.7:1, the mass ratio of the monocrystalline diamond to the micron-scale metal powder is 5:1;

(2) the slurry was granulated by a spray drying process to obtain a monocrystalline diamond-nickel-iron composite particle in the form of a spherical agglomeration having a diameter of 100 μm;

(3) placing the composite particle obtained from step (2) were placed in an vacuum furnace with a vacuum atmosphere at 900° C. for 2 hours and then cooled to room temperature;

(4) 1000 mL of dilute nitric acid with a mass concentration of 30% was added into the composite particle of step (3), and the inorganic acid treating is carried out for 4 hours at 90° C. so as to remove the nickel grain and iron grain from the composite particle; the liquid after sedimentation to was dumped and obtained wet powder, the wet power was washed 4 times with the deionized water and then dried to obtain dry powder; concentrated sulfuric acid was added into the dry powder for oxidative acid treating for 7 hours at 200° C. so as to remove non-diamond carbon from the monocrystalline diamond surface, then it was washed with water to neutrality and finally dried to obtain the monocrystalline diamond abrasive grain having a unique surface morphology, a median diameter of 6.13 μm. FIG. 3 is a scanning electron microscope (SEM) image of 6.13 μm of the monocrystalline diamond abrasive grain, it can be seen that the monocrystalline diamond abrasive grain has a unique rough-surface morphology, a layered surface, an uneven surface, a plurality of contact points and contact surfaces presented in the grinding process, a high self-sharpening, thus the grinding force is high. After the above treatments, the yield rate of the monocrystalline diamond abrasive grain is 59.2%.

EXAMPLE 3

Figure 4:
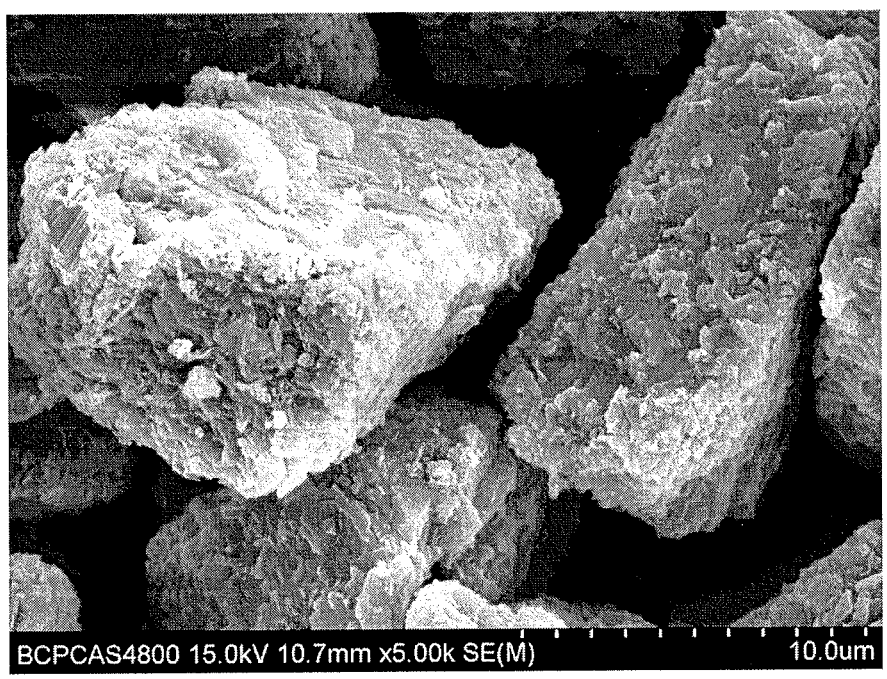
FIG. 4 is a scanning electron microscope (SEM) image of 13.25 μm of the monocrystalline diamond abrasive grain of the present invention.

The embodiment provides a method of preparing a monocrystalline diamond abrasive grain comprising the steps of:

(1) 100 g of monocrystalline diamond having a diameter of 13.59 μm, 5 g of nickel powder having a diameter of 4 μm and 5 g of cobalt powder having a diameter of 4 μm were dispersed into 500 mL of a sol, the sol was stirred to form a uniformly dispersed slurry, wherein the sol contains nano-iron having a molar concentration of 1.8 mol/L and nano manganese having a molar concentration of 0.2 mol/L, the nano iron and nano manganese solute of the sol have a diameter of 80 nm and 100 nm respectively, and the solvent of sol is absolute ethyl alcohol; in the slurry, the mass ratio of the monocrystalline diamond to nanometal powder is 1.7:1, the mass ratio of the monocrystalline diamond to micron-scale metal powder is 10:1;

(2) the slurry was granulated by a spray drying process to obtain a monocrystalline diamond-iron-cobalt-nickel-manganese composite particle in the form of a spherical agglomeration having a diameter of 200 μm;

(3) the composite particles obtained from step (2) were placed in an vacuum furnace with a vacuum atmosphere at 800° C. for 5 hours and then cooled to room temperature;

(4) 1000 mL of dilute nitric acid with a mass concentration of 30% was added into the composite particle of room temperature of step (3), and the inorganic acid treating is carried out for 5 hours at 100° C. so as to remove the nickel grain and iron grain from the composite particle; the liquid after sedimentation was dumped and obtained wet powder, the wet power was washed 5 times with the deionized water and then dried to obtain dry powder; concentrated sulfuric acid was added into the dry powder for oxidative acid treating for 8 hours at 200° C. so as to remove non-diamond carbon from the monocrystalline diamond surface, then it was washed with water to neutrality and finally dried to obtain the monocrystalline diamond abrasive grain having a unique surface morphology, a median diameter of 13.25 μm. FIG. 4 is a scanning electron microscope (SEM) image of 13.25 μm of the monocrystalline diamond abrasive grain, it can be seen that the monocrystalline diamond abrasive grain has a unique rough-surface morphology, a layered surface, an uneven surface, a plurality of contact points and contact surfaces presented in the grinding process, a high self-sharpening, thus the grinding force is high. After the above treatments, the yield rate of monocrystalline diamond abrasive grain is 78.5%.

EXAMPLE 4

The embodiment provides a method of preparing a monocrystalline diamond abrasive grain comprising the steps of:

(1) 100 g of monocrystalline diamond having a diameter of 30 μm and 5 g of cobalt powder having a diameter of 10 μm were dispersed into 500 mL of a sol, the sol was stirred to form a uniformly dispersed slurry, wherein the sol contains nano-iron having a molar concentration of 2 mol/L and nano manganese having a molar concentration of 1.6 mol/L, wherein, the nano iron and nano manganese solute of the sol have a diameter of 80 nm and 100 nm respectively, and the solvent of sol is absolute ethyl alcohol; in the slurry, the mass ratio of the monocrystalline diamond to nanometal powder is 1:1, the mass ratio of the monocrystalline diamond to micron-scale metal powder is 20:1;

(2) the slurry was granulated by a spray drying process to obtain a monocrystalline diamond-iron-cobalt-nickel-manganese composite particle in the form of a spherical agglomeration having a diameter of 200 μm;

(3) the composite particles obtained from step (2) were placed in an vacuum furnace with a vacuum atmosphere at 1000° C. for 0.5 hours and then cooled to room temperature;

(4) 1000 mL of dilute nitric acid with a mass concentration of 30% was added into the composite particle of step (3), and the inorganic acid treating is carried out for 5 hours at 100° C. so as to remove the nickel grain and iron grain from the composite particle; the liquid after sedimentation was dumped and obtained wet powder, the wet power was washed 5 times with the deionized water and then dried to obtain dry powder; concentrated sulfuric acid was added into the dry powder for oxidative acid treating for 8 hours at 200° C. so as to remove non-diamond carbon from the monocrystalline diamond surface, then it was washed with water to neutrality and finally dried to obtain the monocrystalline diamond abrasive grain having a unique surface morphology, a median diameter of 28.84 μm. The monocrystalline diamond abrasive grain has a unique rough-surface morphology, a layered surface, an uneven surface, a plurality of contact points and contact surfaces presented in the grinding process, a high self-sharpening, thus the grinding force is high. After the above treatments, the yield rate of the monocrystalline diamond abrasive grain is 83.9%.

EXAMPLE 5

The embodiment provides a method of preparing a monocrystalline diamond abrasive grain comprising the steps of:

(1) 100 g of monocrystalline diamond having a diameter of 0.1 μm and 10 g of iron powder having a diameter of 0.1 μm were dispersed into 500 mL of a nano nickel sol having a molar concentration of 1 mol/L, the sol was stirred to form a uniformly dispersed slurry, wherein, the nano nickel solute of the sol has a diameter of 10 nm and the solvent of sol is absolute ethyl alcohol; in the slurry, the mass ratio of monocrystalline diamond to the nanometal powder is 3.4:1, the mass ratio of the monocrystalline diamond to micron-scale metal powder is 10:1;

(2) the slurry was granulated by a spray drying process to obtain a monocrystalline diamond-nickel-iron composite particle in the form of a spherical agglomeration having a diameter of 10 μm;

(3) the composite particle obtained from step (2) were placed in an vacuum furnace of nitrogen atmosphere at 650° C. for 3 hours and then cooled to room temperature;

(4) 1000 mL of dilute nitric acid with a mass concentration of 30% was added into the composite particle of step (3), and the inorganic acid treating is carried out for 5 hours at 80° C. so as to remove the nickel grain and iron grain from the composite particle; the liquid after sedimentation was dumped and obtained wet powder, the wet power was washed 3 times with the deionized water and then dried to obtain dry powder; concentrated sulfuric acid was added into the dry powder for oxidative acid treating for 6 hours at 100° C. so as to remove non-diamond carbon from monocrystalline diamond surface, then it was washed with water to neutrality and finally dried to obtain the monocrystalline diamond abrasive grain having a unique surface morphology, a median diameter of 0.08 μm. It can be seen that the monocrystalline diamond abrasive grain has a unique rough-surface morphology, a layered surface, an uneven surface, a plurality of contact points and contact surfaces presented in the grinding process, a high self-sharpening, thus the grinding force is high. After the above treatments, the yield rate of the monocrystalline diamond abrasive grain is 51.5%.

CONTROL EXAMPLE 1

The control example provides a method of preparing a monocrystalline diamond abrasive grain comprising the steps of:

(1) A diamond micro grain having a diameter of 3.21 μm was mixed with nickel powder having a diameter of 50 nm in the mass ratio of 1:1, further a certain amount of binder was added to provide lubricity to the grain surface so as to produce a denser packing and intimate contact between the iron powder and the diamond and obtained a mixture, and subsequently, the mixture is compacted into a intimate mixture of diamond and iron powder in the form of a pellet, an aggregate or other shapes;

(2) then the prepared metal-coated diamond grains by the above two kinds of methods were heated in a nitrogen atmosphere at 850° C. for 2 hours, so as to achieve graphitization of the diamond surface, and then cooled the heated grains.

(3) finally, the grains were washed by acid and non-diamond carbon was dissolved to obtain the monocrystalline diamond abrasive grain having a unique morphology. After the above treatments, the monocrystalline diamond abrasive grain has a median diameter of 2.74 μm and a yield rate of 40.5%.

CONTROL EXAMPLE 2

The control example provides a method of preparing a monocrystalline diamond abrasive grain comprising the steps of:

(1) A diamond micro grain having a diameter of 6.49 μm was mixed with iron powder having a diameter of 2 μm in the mass ratio of 1:4, further a certain amount of binder was added to provide lubricity to the grain surface so as to produce a denser packing and intimate contact between the nickel powder and the diamond and obtained a mixture, and subsequently, the mixture is compacted into form a intimate mixture of diamond and iron powder in the form of a pellet, an aggregate or other shapes;

(2) then the prepared metal-coated diamond grains by the above two kinds of methods were heated in a vacuum atmosphere at 900° C. for 2 hours, so as to achieve graphitization of the diamond surface, and then cooled the heated grains.

(3) finally, the grains were washed by acid and non-diamond carbon was dissolved to obtain the monocrystalline diamond abrasive grain having a unique morphology. After the above treatments, the monocrystalline diamond abrasive grain has a median diameter of 5.97 μm and a yield rate of 37.2%.

EXPERIMENTAL EXAMPLE

The resulting monocrystalline diamond abrasive grains from Examples 1-5 and Control Examples 1-2 are separately numbered A1-G1, the untreated monocrystalline diamond abrasive grains are separately numbered A2-E2, and the above various monocrystalline monocrystalline diamond samples are evaluated on the grinding performance.

The evaluation experiment has the following specific operations:

(1) the above various monocrystalline diamond samples were dispersed into a liquid medium of ethylene glycol so as to prepare a series of aqueous grinding fluid having a concentration of 5 g/L separately;

(2) grinding experiment: the lapping plate was a tin plate and the lapping workpieces were sapphire wafers having a diameter of 2 inches; Grinding Conditions: the pressure on the sapphire wafers was 25 kg during lapping process, rotational speed of the sapping plate was 80 r/min, and droplet velocity of the aqueous grinding fluid was 60 d/min, and the lapping is maintained for 60 mins; in the lapping process, the thickness of the sapphire wafers is measured every 10 mins and the average removal rate was calculated according to the six aforementioned datas. Wherein, the computational formula of the removal rate was: $R=(H_n-H_{n+1})/t$, wherein, H represents the thickness of sapphire wafers, n represents lapping times ($0 \leq n \leq 6$), t represents lapping time (t=10 min); R represents removal rate, and the unit is μm/min. After finishing lapping, the surface roughness of sapphire wafers is tested. The test results of removal rate and surface roughness are seen in table 1.

TABLE 1

Evaluation datas of grinding performance of the monocrystalline diamond before and after treatment.

| Sample NOs. | Yield Rate (%) | D50 (μm) | Removal Rate (μm/min) | Roughness (nm) |
| --- | --- | --- | --- | --- |
| A1 | 53.70% | 2.98 | 0.75 | 21 |
| B1 | 59.20% | 6.13 | 1.83 | 32 |
| C1 | 78.50% | 12.25 | 3.56 | 50 |
| D1 | 83.9% | 28.84 | 3.99 | 67 |
| E1 | 51.5% | 0.08 | 0.03 | 0.3 |
| F1 | 40.50% | 2.74 | 0.45 | 48 |
| G1 | 37.20% | 5.97 | 0.99 | 60 |
| A2 | — | 3.21 | 0.34 | 59 |
| B2 | — | 6.49 | 0.8 | 64 |
| C2 | — | 13.59 | 1.67 | 118 |
| D2 | — | 30 | 1.98 | 137 |
| E2 | — | 0.1 | 0.01 | 0.8 |

It can be seen from the datas of table 1, the monocrystalline diamond abrasive grains (A1-E1) prepared by the present invention are twice or three times the removal rate of the untreated monocrystalline diamond abrasive grains (A2-E2), and the roughness value of the sapphire wafers is equivalent to 30%-50% of that of the untreated monocrystalline diamond abrasive grains, thus indicating that the monocrystalline diamond abrasive grains prepared by the present invention has a stronger grinding force, and after grinding the sapphire wafers by using the monocrystalline diamond abrasive grains, the surface roughness of sapphire wafers can be effectively reduced.

However, the monocrystalline diamond abrasive grains of F1 and G1 were prepared respectively by treating the monocrystalline diamond abrasive grains of A2 and B2 by using the method in prior art, and the resulting datas indicated that the removal rates of the samples before and after surface treatment did not vary very apparently; however when the sapphire wafers were grinded by using the monocrystalline diamond abrasive grains of F 1 and G1, the results showed that the surface roughness of the sapphire wafers less reduced, thus indicating that the monocrystalline diamond abrasive grains prepared by the method in prior art has a poor grinding force and cannot effectively reduce the roughness of workpiece and the reasons lie in that: the micron-scale metal powder used in preparation process of Sample G1 cannot has a uniform surface contact with the monocrystalline diamond abrasive grains. Although the nano-scale metal powder is adopted in the preparation process of Sample F1, the agglomeration of the grains cannot be separated in the dry-mixed process of the monocrystalline diamond abrasive grains, and cannot have a sufficient surface contact with the monocrystalline diamond abrasive grains, and thus cannot produce the effect of the nano-scale metal grains.

It is obvious that the above Examples are just recognised to be a clear illustration rather than a restriction of the embodiments. For the person skilled in the art, the implementation with respect to any variation or modification based on the above description may fall into the protection scope of the present invention and there is unnecessary and impossible to be exhaustive of all the embodiments.

The invention claimed is:

1. A method of preparing a monocrystalline diamond abrasive grain comprising the steps of:
   (1) dispersing a micron-scale monocrystalline diamond and at least a micron-scale metal powder into a sol containing at least a nano-scale metal powder, and stirring to form a uniformly dispersed slurry; wherein, the mass ratio of the micron-scale monocrystalline diamond to the nano-scale metal powder is 1:1-4:1;
   the mass ratio of the micron-scale monocrystalline diamond to the micron-scale metal powder is 5:1-20:1;
   the molar concentration of the nano-scale metal powder in the sol is 1-4mol/L;
   (2) granulating the slurry and obtaining a composite particle of the monocrystalline diamond and the two kinds of metal powder in a form of a spherical agglomeration;
   (3) placing the composite particle of step (2) into an vacuum furnace and heating at a temperature of 600-1000° C. for 0.5-5 hours and cooling to room temperature;
   (4) treating the composite particle after step (3) with an inorganic acid and an oxidative acid in sequence, washing to neutrality with water and drying to form the monocrystalline diamond abrasive grain.

2. The method of claim 1, wherein, the micron-scale metal powder and the nano-scale metal powder comprise at least two kinds of metals in total.

3. The method of claim 1, wherein,
   the diameter of the micron-scale monocrystalline diamond is 0.1-30 μm;
   the diameter of the nano-scale metal powder is 10-100 nm;
   the diameter of the micron-scale metal powder is 0.1-10 μm.

4. The method of claim 1, wherein, a solvent of the sol containing the nano-scale metal powder is deionized water and/or absolute ethyl alcohol.

5. The method of claim 1, wherein, the nano-scale metal powder and the micron-scale metal powder are respectively selected from the following group of metal powder:
   iron powder, cobalt powder, nickel powder, manganese powder, or alloyed powder mixed with two or more of iron, cobalt, nickel or manganese.

6. The method of any one of claim 1, wherein, the granulation method in step (2) is a stirring granulation method, a spray-drying method, a boiling granulation method, an extrusion-spheronization granulation method or a centrifugal granulation method.

7. The method of any one of claim 1, wherein, the diameter of the composite particle in step (2) is 10-200μm.

8. The method of claim 1, in step (3), the heating is carried out in a hydrogen atmosphere, vacuum atmosphere, or an inert gas atmosphere inside the vacuum furnace.

9. The method of claim 1, in step (4), the inorganic acid treatment and the oxidative acid treatment comprise the following specific operations:
   adding the inorganic acid into the composite particle and treating for 3-5 hours at 80 -100° C.;
   adding the oxidative acid to the composite particle after the inorganic acid treatment, and treating for 6-8 hours at 150-200° C.

10. The method of claim 2, wherein,
    the diameter of the micron-scale monocrystalline diamond is 0.1-30 μm;
    the diameter of the nano-scale metal powder is 10-100 nm;
    the diameter of the micron-scale metal powder is 0.1-10 μm.

11. The method of claim 2, wherein, the nano-scale metal powder and the micron-scale metal powder are respectively selected from the following group of metal powder:
    iron powder, cobalt powder, nickel powder, manganese powder, or alloyed powder mixed with two or more of iron, cobalt, nickel or manganese.

12. The method of claim 3, wherein, the nano-scale metal powder and the micron-scale metal powder are respectively selected from the following group of metal powder:
    iron powder, cobalt powder, nickel powder, manganese powder, or alloyed powder mixed with two or more of iron, cobalt, nickel or manganese.

13. The method of claim 4, wherein, the nano-scale metal powder and the micron-scale metal powder are respectively selected from the following group of metal powder:
    iron powder, cobalt powder, nickel powder, manganese powder, or alloyed powder mixed with two or more of iron, cobalt, nickel or manganese.

14. The method of claim 10, wherein, the nano-scale metal powder and the micron-scale metal powder are respectively selected from the following group of metal powder:
    iron powder, cobalt powder, nickel powder, manganese powder, or alloyed powder mixed with two or more of iron, cobalt, nickel or manganese.

15. The method of claim 2, in step (3), the heating is carried out in a hydrogen atmosphere, vacuum atmosphere, or an inert gas atmosphere inside the vacuum furnace.

16. The method of claim 3, in step (3), the heating is carried out in a hydrogen atmosphere, vacuum atmosphere, or an inert gas atmosphere inside the vacuum furnace.

17. The method of claim 4, in step (3), the heating is carried out in a hydrogen atmosphere, vacuum atmosphere, or an inert gas atmosphere inside the vacuum furnace.

18. The method of claim 5, in step (3), the heating is carried out in a hydrogen atmosphere, vacuum atmosphere, or an inert gas atmosphere inside the vacuum furnace.

19. The method of claim 10, in step (3), the heating is carried out in a hydrogen atmosphere, vacuum atmosphere, or an inert gas atmosphere inside the vacuum furnace.

20. The method of claim 11, in step (3), the heating is carried out in a hydrogen atmosphere, vacuum atmosphere, or an inert gas atmosphere inside the vacuum furnace.

* * * * *